United States Patent
Hackl

(10) Patent No.: US 12,372,570 B2
(45) Date of Patent: Jul. 29, 2025

(54) METHOD AND ELECTRIC CIRCUIT ARRANGEMENT FOR SELECTIVE INSULATION MONITORING IN A POWER SUPPLY SYSTEM HAVING ISOLABLE SUBSYSTEMS

(71) Applicant: Bender GmbH & Co. KG, Gruenberg (DE)

(72) Inventor: Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/749,527

(22) Filed: Jun. 20, 2024

(65) Prior Publication Data

US 2024/0426894 A1    Dec. 26, 2024

(30) Foreign Application Priority Data

Jun. 23, 2023    (DE) .................. 10 2023 116 532.1

(51) Int. Cl.
*G01R 31/12* (2020.01)
*G01R 27/02* (2006.01)

(52) U.S. Cl.
CPC ....... *G01R 31/1272* (2013.01); *G01R 27/025* (2013.01)

(58) Field of Classification Search
CPC .. G01R 31/1272; G01R 27/025; G01R 27/18; G01R 31/08; G01R 31/40; G01R 31/52
USPC ........................... 324/691, 649, 600
See application file for complete search history.

(56) References Cited

U.S. PATENT DOCUMENTS

| | | | | |
|---|---|---|---|---|
| 11,009,539 B2 * | 5/2021 | Geiss | ............. | G01R 31/52 |
| 2020/0256905 A1 * | 8/2020 | Reitz | ............. | G01R 27/18 |
| 2021/0382104 A1 * | 12/2021 | Becker | ............. | G01R 31/52 |

FOREIGN PATENT DOCUMENTS

| | | |
|---|---|---|
| DE | 102010011476 A1 | 9/2011 |
| DE | 102013209142 A1 | 11/2014 |
| DE | 102018121979 A1 | 3/2020 |
| EP | 2386870 B1 | 11/2017 |
| EP | 2851692 B1 | 6/2019 |
| EP | 2256506 B1 | 7/2019 |
| EP | 3139188 B1 | 11/2019 |
| WO | 2005050229 A1 | 6/2005 |

\* cited by examiner

*Primary Examiner* — Giovanni Astacio-Oquendo
(74) *Attorney, Agent, or Firm* — Dickinson Wright PLLC; Andrew D. Dorisio

(57) ABSTRACT

The invention relates to a method (1) and to an electric circuit arrangement (2) for selective insulation monitoring in a power supply system (10) having isolable subsystems (20) which each has an integrated energy storage (22). In this context, the subsystem to be monitored (20) is cyclically and temporarily isolated (S1) for the duration of a measuring interval (ΔT) with all-pole semiconductor disconnectors (SW); operation of the isolated subsystem (20) to be monitored is continued (S2) by means of its integrated energy storage (22) during the measuring interval (ΔT); and an insulation resistance ($R_f$) of the subsystem (20) is measured (S3) during the measuring interval (ΔT) by means of a standard insulation monitoring device (IMD).

9 Claims, 4 Drawing Sheets

METHOD AND ELECTRIC CIRCUIT ARRANGEMENT FOR SELECTIVE INSULATION MONITORING IN A POWER SUPPLY SYSTEM HAVING ISOLABLE SUBSYSTEMS

This application claims priority to German Patent Application No. 10 2023 116 532.1 filed on Jun. 23, 2023, the disclosure of which is hereby incorporated by reference.

TECHNICAL FIELD

The invention relates to a method and to an electric circuit arrangement for selective insulation monitoring in a power supply system having isolable subsystems which each has an integrated energy storage.

BACKGROUND

To ensure high availability and operational safety of the electric power supply as well as the safety to persons in the occupied area of electric installations, monitoring systems are being more and more widely used which provide information on the insulation state of a branched power supply system in its entirety and on the insulation state of the connected individual subsystems.

In power supply systems having the network form IT system (ungrounded power supply system), an insulation monitoring device according to product standard IEC 61557-8 provides information on the total insulation resistance of the system to ground.

After a declined total insulation resistance has been identified in a power supply system having the network form IT system by means of the insulation monitoring device, insulation fault location systems according to product standard IEC 61557-9 are used in order to detect individual faulty subsystems. The insulation fault location system feeds a localization current (which differs from the measuring current of the insulation monitoring device) to the overall system, this localization current being detected by a current sensor (localization sensor) installed in this subsystem in order to identify the faulty subsystem.

In systems having a grounded network form, residual current monitoring systems according to product standard IEC 62020-x are used in order to estimate the insulation state of subsystems.

In this context, the measuring problems which are described in the following and for which only inadequate solutions have hitherto been found can occur in very large, widely branched power supply systems to be monitored and in heavy current systems when using known insulation monitoring systems available on the market.

Since insulation monitoring systems detect the total insulation resistance of all galvanically connected subsystems as a parallel resistance of all ohmic leakages between the active conductors and ground, this value can take on a critically low insulation resistance value of, for example, a few kOhm in a number of subsystems even though the insulation state of each individual subsystem for the operation is sufficiently high at, for example, several 100 kOhm.

Based solely on the insulation monitoring of the total system, the creeping degradation of the insulation state of a faulty subsystem—owing to the parallel circuit which yields a several times lower total insulation resistance—can only be detected once the insulation state of the faulty subsystem has dropped far below a value acceptable for operation.

In addition, common insulation fault location systems act highly unresponsive in very large, branched IT systems having a low total insulation resistance value, as the supplied localization current is distributed to many subsystems.

In order to exceed the responsiveness of a localization sensor in a subsystem, the insulation fault in this subsystem must become significantly lower in impedance with respect to the total insulation resistance, as the following example shows:

If an insulation fault location system operates with a 50 mA localization current in an IT system having 200 relatively identical subsystems, approximately 250 µA localization current to be identified remains per subsystem. If the localization sensor has a responsiveness of 2 mA, a faulty subsystem must consequently have an insulation resistance lower by approximately a factor of 8 than all other subsystems in order for a localization sensor to respond.

In IT systems with very large load currents, the localization sensors, which commonly operate based on residual currents, become less responsive due to saturation effects in the magnetically soft material. Degradation processes in individual subsystems can only be detected once they have progressed greatly.

In systems having a grounded network form and very large load currents, the residual current sensors of a residual current monitoring system become less responsive due to saturation effects in the magnetically soft material. In this case as well, degradation processes in individual subsystems can only be identified once greatly progressed.

Residual current monitoring systems are inherently incapable of identifying symmetrical insulation faults.

It is therefore necessary to detect the insulation state of subsystems, including in large direct and alternating current systems, having a grounded or ungrounded network form and under the influence of large load currents, highly responsively and nearly continuously during operation.

A practice in IT systems as is common in the state of the art consists of avoiding large interconnected IT systems. This is accomplished with the aid of additional isolating transformers and is disadvantageously linked to high costs.

For grounded power supply systems, other approaches for detecting the insulation resistance are known from the state of the art.

One approach for selective insulation monitoring of subsystems is described in EP 2 851 692 B1. In this specification, a residual current measuring device, a test signal generator as well as a blocking device and a selective decoupling device are disposed in each subsystem. The circuitry effort is so great in practice that this approach has hitherto not been applied.

In the application document EP 1 687 646 A1, the residual-current measuring signal portion generated by the supplied common-mode voltage signal is determined from a residual current via filtering and the common-mode voltage signal to ground present at the line conductors at the measuring location is detected at the measuring location. The common-mode voltage signal portion based on the supplied common-mode voltage signal is determined from the thus detected common-mode voltage signal via filtering and the ohmic portion of the insulation resistance between the line conductors and ground is determined at the measuring location by forming quotients between the current common-mode voltage signal portion at the measuring location and the current residual-current measuring signal portion.

Application document DE 10 2018 121 979 A1 describes a method for determining an insulation resistance and for locating insulation faults for a power supply systems supplied by converters. At the outlet of the converter, a common mode voltage to ground is generated in this context, the common mode voltage being superposed on the ungrounded network as an active measuring voltage in order to measure the insulation resistance.

The circuitry effort for the aforementioned methods and their implementation, however, is very great, meaning these approaches hitherto could not prevail on the market.

Another disadvantage of the implementation of methods which are based on residual current monitoring technology is that subsystems are often not monitored using absolute thresholds in widely branched, grounded heavy current systems but by observing trends. In an operating state of a subsystem defined as "good", a residual current value is detected as a reference value and an increasing residual current in this subsystem having a delta residual current value defined as critical leads to an alarm signal. Since common residual current converters physically form a square sum of all residual current portions, the achievable responsiveness of this method is not particularly high for the "good" state in subsystems having high residual current values.

As the state of the art, offline monitoring also finds use in systems having grounded and ungrounded network forms.

In offline monitoring, insulation monitoring takes place for individual consumers when in the shut-down state. It is characterizing for offline monitoring that the monitored consumer remains on standby for a long period of time, such as hours, days or months, when shut down, for all parts of the consumer which are insulation-monitored offline and are galvanically connected to active conductors in the active state must also be galvanically accessible in the shut-down stand-by state via offline insulation monitoring. Examples are pump motors, emergency transformers or point heaters.

In addition to this, currently prevalent converter systems or switching power supplies according to the state of the art cannot be insulation-monitored offline as of yet.

SUMMARY

The object of the invention at hand is therefore to design a method and an electric circuit arrangement for a power supply system having isolable subsystems which each has an integrated energy storage as a prerequisite, the method and the electric circuit arrangement allowing insulation monitoring compatible with all network forms and selectively referring to the individual subsystem in each case while simultaneously saving on circuitry resources and taking into consideration current technological advances.

These objects are attained in a method having the following steps: cyclic, temporary isolation of the subsystem to be monitored for the duration of a measuring interval with all-pole semiconductor disconnectors; continued operation of the isolated subsystem to be monitored by means of its integrated energy storage during the measuring interval; and measuring an insulation resistance of the subsystem during the measuring interval by means of a standardized insulation monitoring device.

As a system requirement for the implementation of the method according to the invention, it is presumed that the power supply system has isolable subsystems having at least one integrated energy storage irrespective of the grounded or ungrounded network form. In this context, the energy storage is presumed to be designed such that it allows continuing operation of the subsystem to be monitored without disturbance for a short period of time (measuring interval).

Owing to the currently increasing use of converter-controlled systems and switching power supplies having inherent energy storages as a result of technological advances, the requirement of an undisturbed continued operation is mostly fulfilled for a sufficiently short interval.

"Temporary" or "short interval" is understood as an interval referring to standard EN 50160 which describes the interpretation of operating means to be expected with regard to the voltage quality as in the current technical state of the art, in particular with regard to the duration of voltage drops. In this context, a duration of <1 s can be presumed as a measuring interval, within which the operating means can continue to function without impairments.

Building on this, the fundamental idea of the invention at hand consists of isolating the subsystem to be monitored for a measuring interval via cyclic isolation while, however, simultaneously continuing operation by means of the inherent energy storage and measuring an insulation resistance during the measuring interval. The insulation resistance measurement can be concluded within a measuring interval irrespective of the implemented measuring method or extend over a sequence of measuring intervals (see below).

The solution according to the invention therefore is based on the combination of a) a cyclic isolation of the subsystem to be monitored of the entire power supply system for the duration of a measuring interval;

b) the property of the subsystem that operation of the subsystem can be continued in an operatively undisturbed manner during the measuring interval by means of the (inherent) energy storages in the subsystem; and c) an insulation monitoring system (insulation monitoring device according to IEC 61557-8) which actively and standardly detects the insulation resistance of the subsystem in the operating state within the measuring interval in the isolated state of the subsystem.

Advantageously, a method for subsystem-selective insulation monitoring is created which saves circuitry resources, requires little installation space, is inexpensive, can be implemented for all network forms and also takes into consideration current technological advances, in particular converter architectures.

For instance, it is no longer necessary to install an additional residual current transformer for the insulation fault location or residual current monitoring for each subnetwork to be monitored.

Since these components commonly contain considerable amounts of softly magnetic materials, they are expensive, require much installation space and are relatively energy-intensive to produce.

In comparison thereto, the method according to the invention having a cost-optimized, integrated circuit can be implemented economically, installation-space-neutral and having a small ecological footprint.

In another advantageous embodiment, the measurement takes place using a measuring method which allows determining in a sufficiently reliable manner the insulation resistance within precisely one measuring interval or in a cyclic sequence of several measuring intervals.

Thus, measuring methods are used which either provide a sufficiently precise prediction regarding the actual insulation resistance of the subsystem synchronously within precisely one measuring interval or are cyclically active during a sequence of several consecutive measuring intervals synchronously with the pulsing of the isolation process in order to determine the insulation resistance within several cycles or to optimize the determination.

Preferably, the implemented measuring method is a pulse measuring method with an evaluation of a time constant determined in the subsystem by a capacitance charge.

A pulsed measuring voltage as intended by the pulse measuring method and superposed on the power supply system by a measuring pulse generator of the insulation monitoring device allows evaluating a capacitance-charged e-function (natural exponential function). Based on the time constants derived therefrom, important insight on the insulation state can be won preemptively during the charging or discharging of the subsystem network capacities (sub-tau method).

Advantageously, semiconductor disconnectors having sufficiently high-impedance isolation properties are used.

The increasing prevalence of semiconductor switches, which have isolating properties and can very quickly cyclically isolate a subsystem from a main system for a measuring interval nearly without limitation to the number of switches, opens up the possibility of insulation monitoring of subsystems in a circuitry-wise simple and economic manner.

The isolating properties of the semiconductor switch must have a sufficiently high impedance in order to not limit the dynamic range of the insulation monitoring system. The aim is to achieve insulation states in the MOhm range.

Furthermore, should the semiconductor disconnectors not have sufficiently high-impedance isolation properties, a basic insulation value is taken into consideration when determining the insulation resistance.

If the prerequisite of a sufficiently high impedance in the isolation properties cannot be fulfilled, the influence of the limited insulation capacity of the semiconductor isolation switch on the insulation monitoring of the subsystem in the measuring and evaluation method should be considered. For instance, insulation of a subsystem could be monitored according to a semiconductor rectifier (see below) synchronously to the network frequency in times during which no load current flows. The ohmic leakage currents of the semiconductor rectifier would then have to be taken into consideration as a parallel switched, system-related basic insulation value when detecting the insulation resistance of the subsystem.

Advantageously, a semiconductor rectifier is used as the semiconductor disconnector.

By means of a rectifier circuit, a conducting phase and an idle phase for controlling the duration of the measuring interval can be determined as a function of a threshold. Since the available measuring interval is significantly shorter in this case, the insulation resistance is determined over several measuring intervals, suitable measuring methods deviating from the pulse measuring method being implemented.

Preferably, the convertor's energy storage is used when using a convertor system in the subsystem and/or the switching power supply's energy storage is used when using switching power supplies.

Owing to the use of convertor-controlled systems and switching power supplies having inherent energy storages, which is currently increasing as a result of technological advances, the requirement of an uninterrupted continued operation can be fulfilled for a sufficiently short period in most cases.

The claimed structural features of the electric circuit arrangement according to the invention implement the corresponding steps of the method according to the invention. Consequently, the technical effects achieved using the method and the advantages resulting therefrom equally pertain to the electric circuit arrangement according to the invention.

BRIEF DESCRIPTION OF THE DRAWINGS

Further advantageous embodiment features are derived from the following description and the drawings, which describe a preferred embodiment of the invention by means of examples.

DETAILED DESCRIPTION

Figure 1:
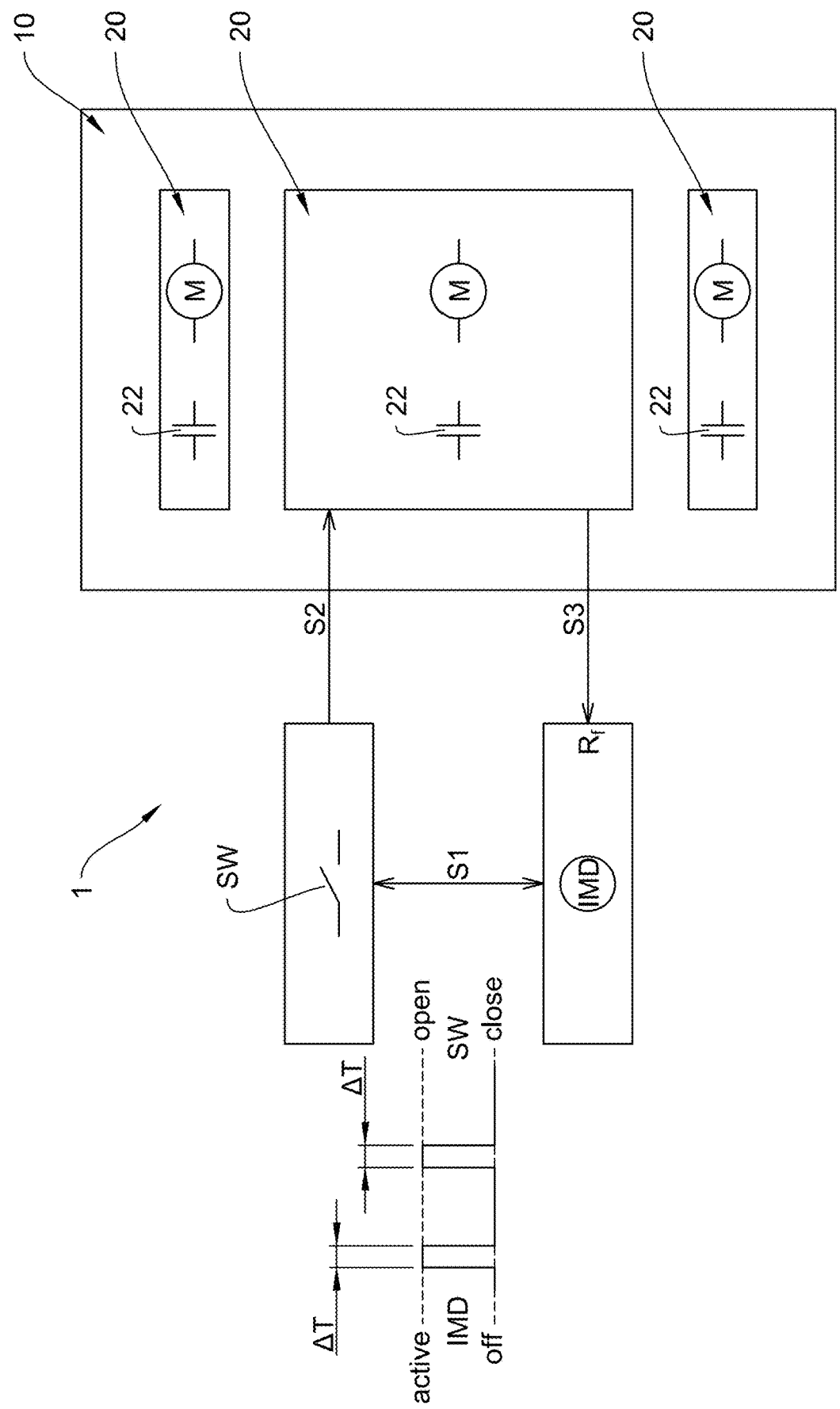
FIG. 1 shows a method according to the invention.

FIG. 1 shows a method 1 according to the invention in conjunction with a subsystem 20 to be monitored of a power supply system 10 consisting of several subsystems 20.

In this view, subsystem 20 to be monitored is cyclically, temporarily isolated in step S1 for the duration of a measuring interval $\Delta T$ by means of all-pole semiconductor disconnectors SW.

During measuring interval $\Delta T$ in step S2, semiconductor disconnectors SW are in the open state and the operation of thus isolated subsystem 20 is continued operatively undisturbedly via energy storages 22 present in subsystem 20.

Simultaneously in step S3, an insulation monitoring device IMD is active during measuring interval $\Delta T$ in order to determine insulation resistance $R_f$ of isolated subsystem 20 within measuring interval $\Delta T$ or in order to continue the measurement of insulation resistance $R_f$ and to thus continuously increase the precision of the insulation resistance monitoring.

Figure 2:
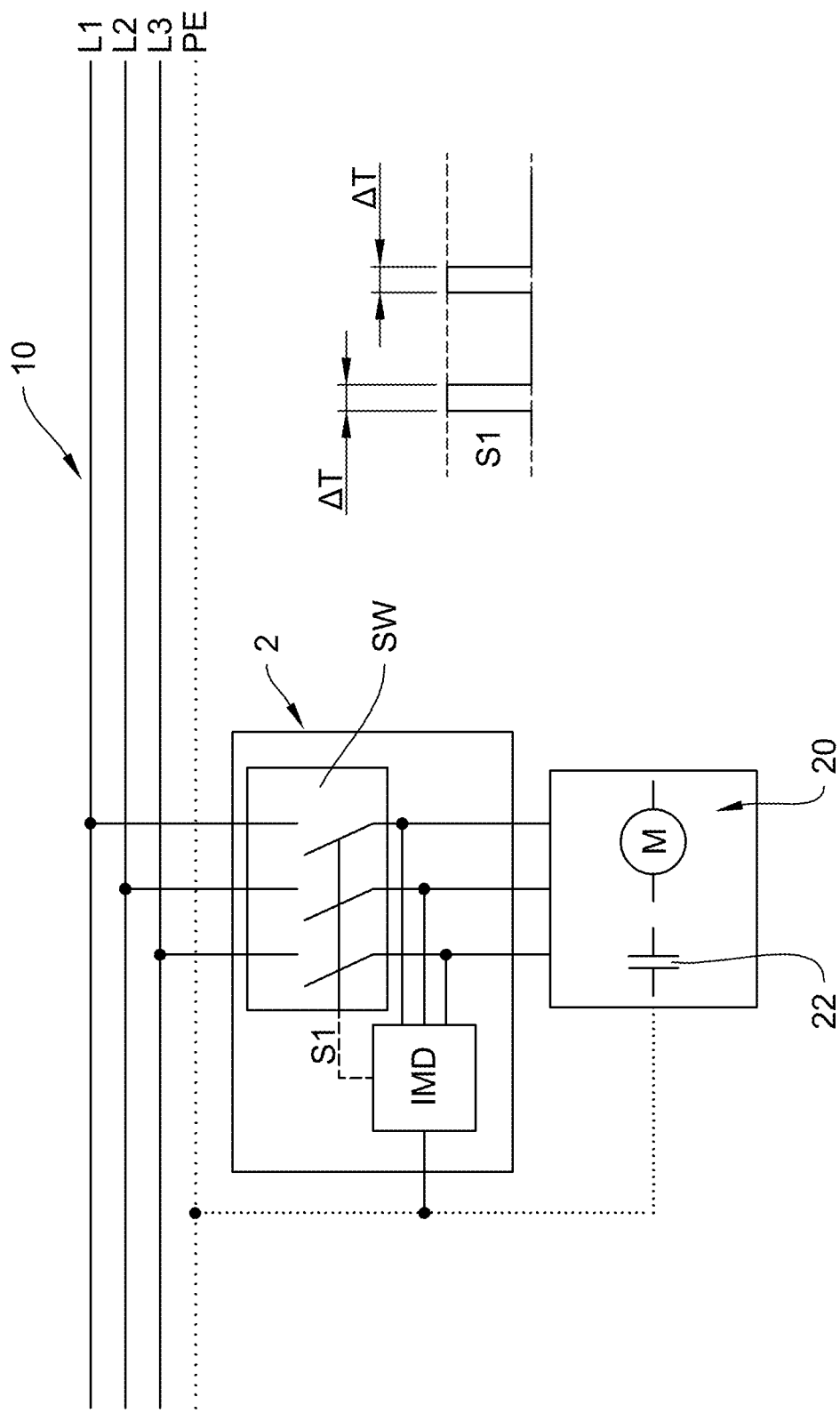
FIG. 2 shows a functional block circuit diagram of an electric circuit arrangement according to the invention in a 3 AC power supply system.

FIG. 2 shows a functional block diagram of an electric circuit arrangement 2 according to the invention in a 3 AC power supply system 10. 3 AC power supply system 10 comprises active conductors L1, L2, L3 and a protective conductor (ground) PE. As a prerequisite, subsystem 20 having energy storages 22 is connected to power supply system 10.

Electric circuit arrangement 2 according to the invention comprises an insulation monitoring device IMD which is designed according to standard IEC 61557-8 and is connected between active conductors L1, L2, L3 of subsystem 20 and ground PE and to all-pole semiconductor disconnectors SW.

Semiconductor disconnectors SW cyclically isolate subsystem 20 to be monitored from the main system for the duration of measuring interval $\Delta T$ (step S1), insulation resistance $R_f$ of subsystem 20 being measured during measuring interval $\Delta T$ synchronously to the switching state of semiconductor disconnectors SW—hinted at by the connection marked with S1 between semiconductor disconnectors W and insulation monitoring device IMD.

By means of energy storages 22 present in subsystem 20, a continuous operation of subsystem 20 is also ensured during measuring interval $\Delta T$ in the isolated state (step S3, FIG. 1).

Figure 3:
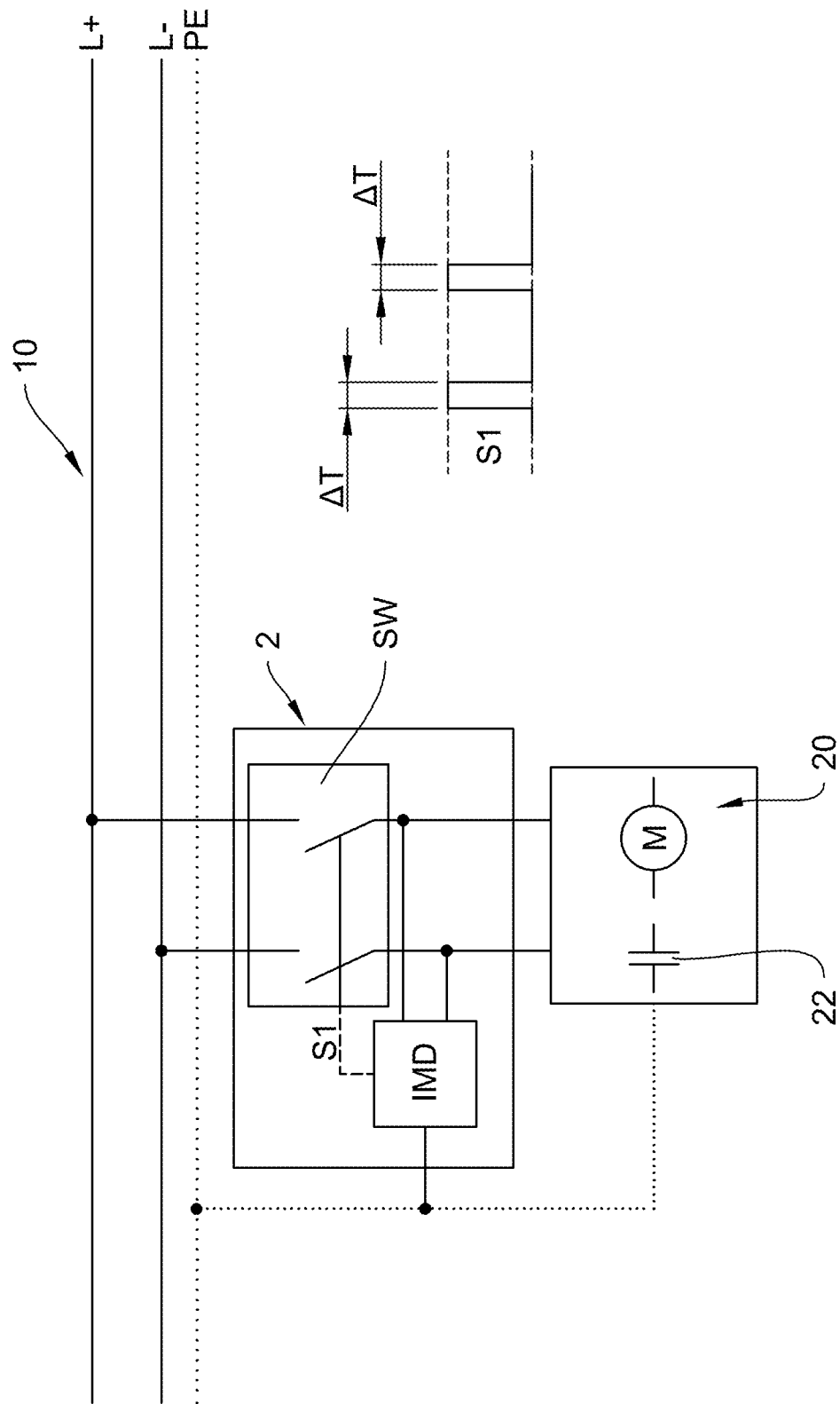
FIG. 3 shows a functional block circuit diagram of an electric circuit arrangement according to the invention in a DC power supply system.

FIG. 3 shows electric circuit arrangement 2 in a DC power supply system 10 having active conductors L+, L−. The difference to the arrangement described in FIG. 2 lies merely in the bipolar coupling of insulation monitoring device IMD and the bipolar implementation of semiconductor disconnectors SW.

Figure 4:
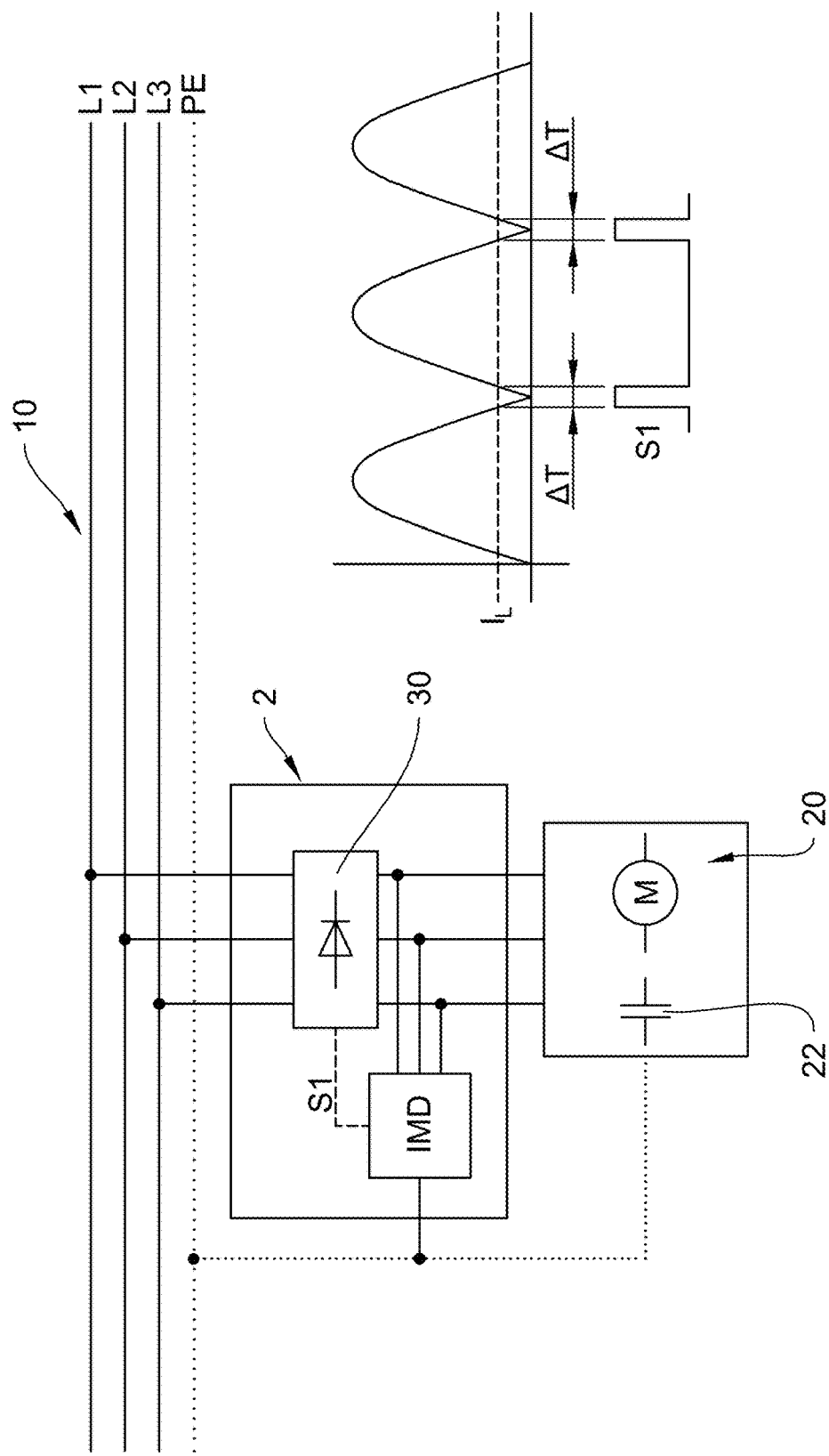
FIG. 4 shows a functional block circuit diagram of an electric circuit arrangement according to the invention in a 3 AC power supply system having semiconductor rectifiers.

The view in FIG. 4 is based on the arrangement in FIG. 2 for insulation monitoring in a 3 AC power supply system 10. A semiconductor rectifier 30 is installed as all-pole semiconductor disconnector SW in this case. Below a load-current threshold $I_L$ to be set, subsystem 20 can be deemed as isolated, meaning insulation monitoring device IMD is activated during these measuring intervals ΔT during which no or only a small load current flows. The ohmic leakage currents of the semiconductor rectifier flowing during measuring intervals ΔT are taken into consideration when detecting insulation resistance $R_f$ of subsystem 20.

The invention claimed is:

1. A method (1) for selective insulation monitoring in a power supply system (10) having isolable subsystems (20) which each has an integrated energy storage (22), the method comprising the following steps:
cyclic, temporary isolating (S1) the isolable subsystems to be monitored for a duration of a measuring interval (ΔT) with all-pole semiconductor disconnectors (SW),
continued operating (S2) the isolated isolable subsystems (20) to be monitored by means of its integrated energy storage (22) during the measuring interval (ΔT),
measuring (S3) an insulation resistance ($R_f$) of the isolable subsystems (20) during the measuring interval (ΔT) by means of a standardized insulation monitoring device (IMD).

2. The method according to claim 1, characterized in that the measuring (S3) is implemented using a measuring method which allows a sufficiently reliable determination of the insulation resistance ($R_f$) within precisely one measuring interval (ΔT) or in a cyclic sequence of several measuring intervals (ΔT).

3. The method according to claim 2, characterized in that the implemented measuring method is a pulse measuring method with an evaluation of a time constant determined in the isolable subsystems (20) by a capacitance charge.

4. The method according to claim 1, characterized by the use of all-pole semiconductor disconnectors (SW) having sufficiently high-impedance isolation properties.

5. The method according claim 1, characterized in that should the all-pole semiconductor disconnectors (SW) not have sufficiently high-impedance isolation properties, a basic insulation value is taken into consideration when determining the insulation resistance ($R_f$).

6. The method according to claim 1, characterized in that the integrated energy storage (22) is used when using a convertor system in the isolable subsystems (20) and/or switching power supply's energy storage is used when using switching power supplies.

7. The method according to claim 1, characterized in that a semiconductor rectifier (30) is used as the all-pole semiconductor disconnectors (SW).

8. An electric circuit arrangement (2) for selective insulation monitoring in a power supply system (10) having isolable subsystems (20) which each has an integrated energy storage, the electric circuit arrangement (2) having:
all-pole semiconductor disconnectors (SW) for cyclic, temporary isolation (S1) of the isolable subsystems (20) to be monitored for a duration of a measuring interval (ΔT), operation of the isolated isolable subsystems (20) to be monitored being continued by means of an integrated energy storage (22) during the measuring interval (ΔT), and
having a standard insulation monitoring device (IMD) for measuring (S3) an insulation resistance ($R_f$) of the isolable subsystems (20) during the measuring interval (ΔT).

9. The electric circuit arrangement (2) according to claim 8, characterized in that the all-pole semiconductor disconnectors (SW) have a sufficiently high-impedance isolation property.

* * * * *